United States Patent
Kim et al.

(10) Patent No.: US 7,370,237 B2
(45) Date of Patent: May 6, 2008

(54) SEMICONDUCTOR MEMORY DEVICE CAPABLE OF ACCESSING ALL MEMORY CELLS

(75) Inventors: Hong-Beom Kim, Gyeonggi-do (KR); Kyu-Young Nam, Gyeonggi-do (KR); Hee-Jun Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 624 days.

(21) Appl. No.: 10/779,160

(22) Filed: Feb. 12, 2004

(65) Prior Publication Data

US 2004/0216006 A1    Oct. 28, 2004

(30) Foreign Application Priority Data

Apr. 11, 2003    (KR)    ............... 10-2003-0022844

(51) Int. Cl.
  *G06F 11/00*    (2006.01)
(52) U.S. Cl. ....................................... 714/30
(58) Field of Classification Search ............... 714/28, 714/29, 30, 31, 718, 743, 42, 27, 32, 43, 714/48; 711/213
See application file for complete search history.

(56) References Cited

U.S. PATENT DOCUMENTS

| | | | | |
|---|---|---|---|---|
| 5,422,892 A | * | 6/1995 | Hii et al. ................. | 714/735 |
| 5,682,472 A | * | 10/1997 | Brehm et al. .............. | 714/25 |
| 6,298,429 B1 | | 10/2001 | Scott et al. | |
| 6,353,563 B1 | * | 3/2002 | Hii et al. ................. | 365/201 |
| 6,499,121 B1 | * | 12/2002 | Roy et al. ................. | 714/724 |
| 6,801,461 B2 | * | 10/2004 | Hii et al. ................. | 365/201 |
| 6,971,045 B1 | * | 11/2005 | Deb et al. ................. | 714/30 |
| 7,076,710 B2 | * | 7/2006 | Knips et al. .............. | 714/734 |
| 2001/0044918 A1 | * | 11/2001 | Sato et al. ................ | 714/718 |
| 2002/0170012 A1 | | 11/2002 | Ernst et al. | |

* cited by examiner

*Primary Examiner*—Nadeem Iqbal
(74) *Attorney, Agent, or Firm*—Marger Johnson & McCollom, P.C.

(57) ABSTRACT

A semiconductor memory device according to embodiments of the invention includes N channels for interface with an outside. During a test mode where the semiconductor memory device is tested by a tester having M channels, K ones of the N channels of the memory device are connected to the M channels of the tester, N being more than M and M being equal to or more than R*K (where R is an integer).

19 Claims, 10 Drawing Sheets

Fig. 1

|     | 000 | 001 | 010 | 011 | 100 | 101 | 110 | 111 |
|-----|-----|-----|-----|-----|-----|-----|-----|-----|
| 000 |     |     |     |     |     |     |     |     |
| 001 |     |     |     |     |     |     |     |     |
| 010 |     | A   |     |     |     |     |     |     |
| 011 |     |     |     |     |     |     |     |     |
| 100 |     |     |     |     |     | B   |     |     |
| 101 |     |     |     |     |     |     |     |     |
| 110 |     |     |     |     |     |     | C   |     |
| 111 |     |     |     |     |     |     |     |     |

→ Row
↓ Column

SEMICONDUCTOR MEMORY DEVICE CAPABLE OF ACCESSING ALL MEMORY CELLS

CROSS REFERENCE TO RELATED APPLICATIONS

This application claims priority from Korean Patent Application No. 2003-22844, filed on Apr. 11, 2003, the contents of which are hereby incorporated by reference in their entirety.

BACKGROUND OF THE INVENTION

1. Technical Field of the Invention

This disclosure relates to a semiconductor integrated circuit device and in particular to a semiconductor memory device.

2. Description of the Related Art

Various procedures including designing, processing, packing, and testing are required to make semiconductor integrated circuits. In addition, the testing is classified into function, parameter, and burn-in methods. In these methods, semiconductor integrated circuits may be tested at a wafer, die, or package level. Although packing was a relatively cheap procedure, semiconductor makers packaged devices before testing (or before appropriate operations of a semiconductor integrated circuit device were secured). But, in connection with the fact that the structure of semiconductor integrated circuit devices is becoming increasingly complicated, the testing of semiconductor integrated circuit devices is required at a wafer or die level in order to reduce possibility of packing abnormal semiconductor integrated circuit devices.

As in packing procedures, control, address and data pins are necessary for accessing a semiconductor memory device at a wafer level. Memory cells are accessed by proper row and column addresses. This addressing method is hereinafter referred to as "an absolute addressing method". This addressing method requires not only the control and the data pins but also all the address pins, even at testing of package and wafer levels.

As an integration degree of semiconductor memory devices increase, the required test time increases in proportion to the integration degree. Increases in test time leads to increased fabrication costs and decreased productivity. Thus, it is desirable to reduce the required test time. In general, there are several ways to shorten the required test time at a wafer state.

One method is to reduce the testing time, which increases the number of semiconductor memory devices under test per unit time. This method causes a quality problem due to under-screening.

A second method is to reduce the number of semiconductor memory devices under test per a unit time by increasing the number of semiconductor memory devices that are tested at the same time. This method is greatly dependent upon the performance of a tester.

Still another method is to improve a process, which is a managing or systematic problem rather than a technical problem.

A basic limitation to the second method is that the number of channels of a tester is fixed. In general, for example, a tester provides 50 channels to test one memory device. As described above, writing/reading data in/from a memory (e.g., DRAM) at a wafer level is made using 5 control pins (e.g., CKE, CLK, /RAS, /CAS, /WE), 15 address pins (e.g., A0-A12, BA0-BA1) and 8/16 data pins (e.g., DQ0-DQ7 or DQ0-DQ15). That is, about 28 to 36 pins are used to test a memory device at a wafer level. Consequently, only one memory device may be tested using a tester that provides 50 channels, leaving 14 to 22 pins unused.

To test more semiconductor devices at the same time using the same tester, a way to test all the devices using a reduced number of address pins is needed. Embodiments of the invention address these and other limitations of the conventional art.

SUMMARY OF THE INVENTION

Some embodiments of the invention provide a semiconductor memory device capable of reducing a test time.

Other embodiments of the invention provide a semiconductor memory device that enables all memory cells to be accessed using a subset of the address pins.

BRIEF DESCRIPTION OF THE DRAWINGS

A more complete appreciation of the invention, and many of the attendant advantages thereof, will become readily apparent by reference to the following detailed description when considered in conjuction with the accompanying drawings in which like reference symbols indicate the same or similar components.

FIG. 1 is a table illustrating an addressing method according to some embodiments of the invention.

DETAILED DESCRIPTION OF THE INVENTION

Figure 2:
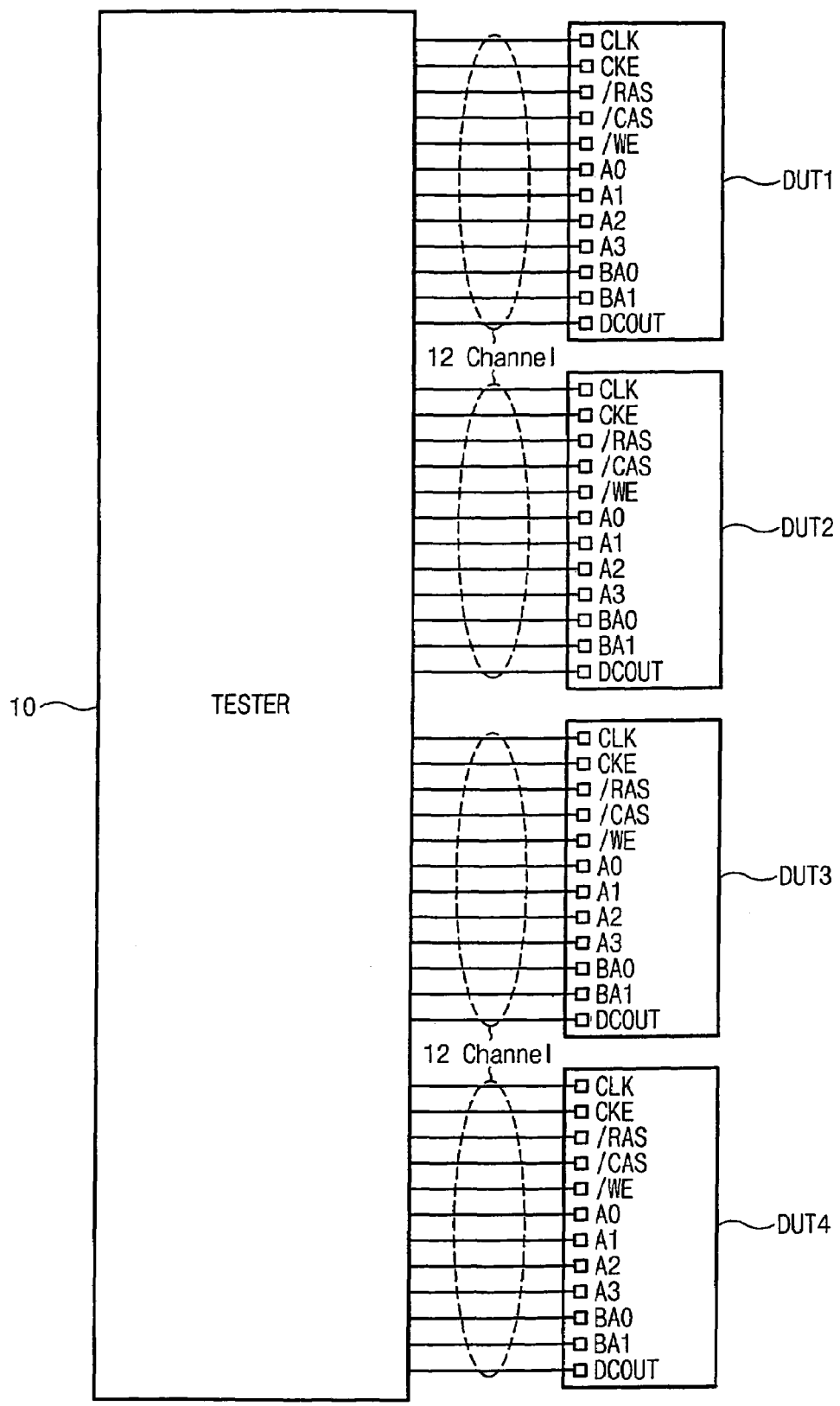
FIG. 2 is a block diagram illustrating the connections between a tester and several semiconductor memory devices according to some embodiments of the invention.

Exemplary embodiments of the invention will be more fully described with reference to the attached drawings.

A semiconductor memory device according to some embodiments of the the invention is configured to access all memory cells at a wafer level test mode using a subset of the address pins. The address pins are used to receive address signals from a tester. The received address signals are used not to specify particular memory cells, but to specify a shift distance (or a jump distance) from a presently selected memory cell to the next selected memory cell during a wafer level test mode. That is, the semiconductor memory device selects memory cells using a relative addressing method instead of a direct addressing method. The relative addressing method is a method of specifying how far the next selected memory cell is from the presently selected memory cell.

FIG. 1 is a table illustrating an addressing method according to some embodiments of the invention. Referring to FIG. 1, assume that a memory cell A is located at an absolute address region of column 1, row 2 (binary 001, 010) and a memory cell B is located at an absolute address region of column 5, row 4 (binary 101, 100). During a conventional mode of operation, the memory cell A is accessed using the absolute address of (001, 010) and the memory cell B is accessed using the absolute address of (101, 100).

With the relative addressing method according to some embodiments of the invention, the memory cell A that is located at an absolute address region of (001, 010) is selected by shifting in a row direction by 1 (binary 001) and in a column direction by 2 (binary 010) from an absolute address region of (000, 000). Likewise, the memory cell B located at an absolute address region of (101, 100) is selected by shifting in a row direction by 4 (binary 100) and in a column direction by 2 (binary 010) from an absolute address region of (001, 010). A memory cell C located at an absolute address region of (110, 110) is selected by shifting in a row direction by 1 (or 001) and in a column direction by 2 (or 010) from an absolute address region of (101, 100).

In describing embodiments of the present invention, the term "jump" is used to indicate how far a selected memory cell is displaced from the previously selected memory cell. Accordingly, a memory cell A is selected by jumping in a row direction by 1 and in a column direction by 2 from an initial reference point (000, 000). A memory cell B is selected by jumping in a row direction by 4 and in a column direction by 2 from a second reference point (or, a presently selected memory cell) (001,010), and a memory cell C is selected by jumping in a row direction by 1 and in a column direction by 2 from a third reference point (or, a presently selected memory cell) (101,100).

The sign of the numbers associated with the jump range indicates whether the row and column addresses are incremented or decremented. Using the previous example, jumping in a row direction by −1 and a column direction by −2 from the memory cell C would return to memory cell B as the selected memory cell.

As understood from the above description, memory cells can be selected without using absolute addresses by setting an initial reference point and specifying the jump distance from the initial reference point to a target point. Alternatively, the jump distance from a presently selected point to the next selected point may be specified.

Embodiments of the invention internally generate an address for selecting a memory cell according to this relative addressing principle. For example, a jump command for jumping from a current point to a next point is provided to a semiconductor memory device via a subset of the address pins that are conventionally used to receive an absolute address, and the memory device interprets the jump command to generate an internal address for specifying the next point.

With a semiconductor memory device according to embodiments of the invention, a subset of the address pins are used by selecting memory cells using a relative addressing method. This means that the required number of pins needed for a device under test (DUT) at a wafer test mode of operation is reduced.

For example, 15 address pins are required to select memory cells using a conventional absolute address in 256 Mbit SDRAM. A plurality of control pins (e.g. five control pins) for receiving control signals (e.g. CLK, CKE, /RAS, /CAS and /WE), a plurality of data pins (e.g. eight or sixteen data pins) for inputting/outputting data, and at least one voltage measurement pin are necessary. A pin number needed to test a memory device is about 29-36. The number of channels provided from a conventional tester is about 50. Accordingly, only one memory device can be tested with a tester having 50 channels that uses the absolute addressing scheme.

When using a relative addressing method according to some embodiments invention, address pins (e.g. four address pins) for receiving a jump command and address pins (e.g. two address pins) for receiving a bank address are used, which will be more fully described below. The address pins for receiving the jump command are shared with data pins. Therefore, only twelve pins (six address pins, five control pins, and at least one voltage measurement pin) are needed to test one memory device, which will be more fully described below.

FIG. 2 is a block diagram illustrating the connections between a tester and a semiconductor memory device according to some embodiments of the invention. FIG. 2 illustrates the connection relationship between memory devices (DUT) and the channels of one tester. Referring to FIG. 2, each of devices under test DUT1, DUT2, DUT3 and DUT4 includes five control pads or pins CLK, CKE, /RAS, /CAS and /WE, six address pads or pins A0, A1, A2, A3, BA0 and BA1, and one voltage measurement pad or pin DCOUT. Although not shown in this figure, it is obvious that each device under test may include additional power pads or pins, data pads or pins, or address pads or pins. The devices under test DUT1-DUT4 are devices at a wafer level. One device under test is connected to the tester 10 via twelve channels. Assuming that the tester 10 may provide up to 50 channels, four memory devices DUT1-DUT4 are simultaneously tested by one tester 10 using only 48 channels.

For example, assume that a tester supports N channels and a plurality of integrated circuit memory devices R (R is an integer) has M channels for interfacing with the outside. During a test mode of operation where the R memory devices are tested, K channels from each memory device are connected to M channels of the tester. N is more than M, and M is greater than or equal to R*K. If more channels are provided by the tester, R becomes a greater number. That is, the number of devices that may be tested simultaneously is increased.

Figure 3:
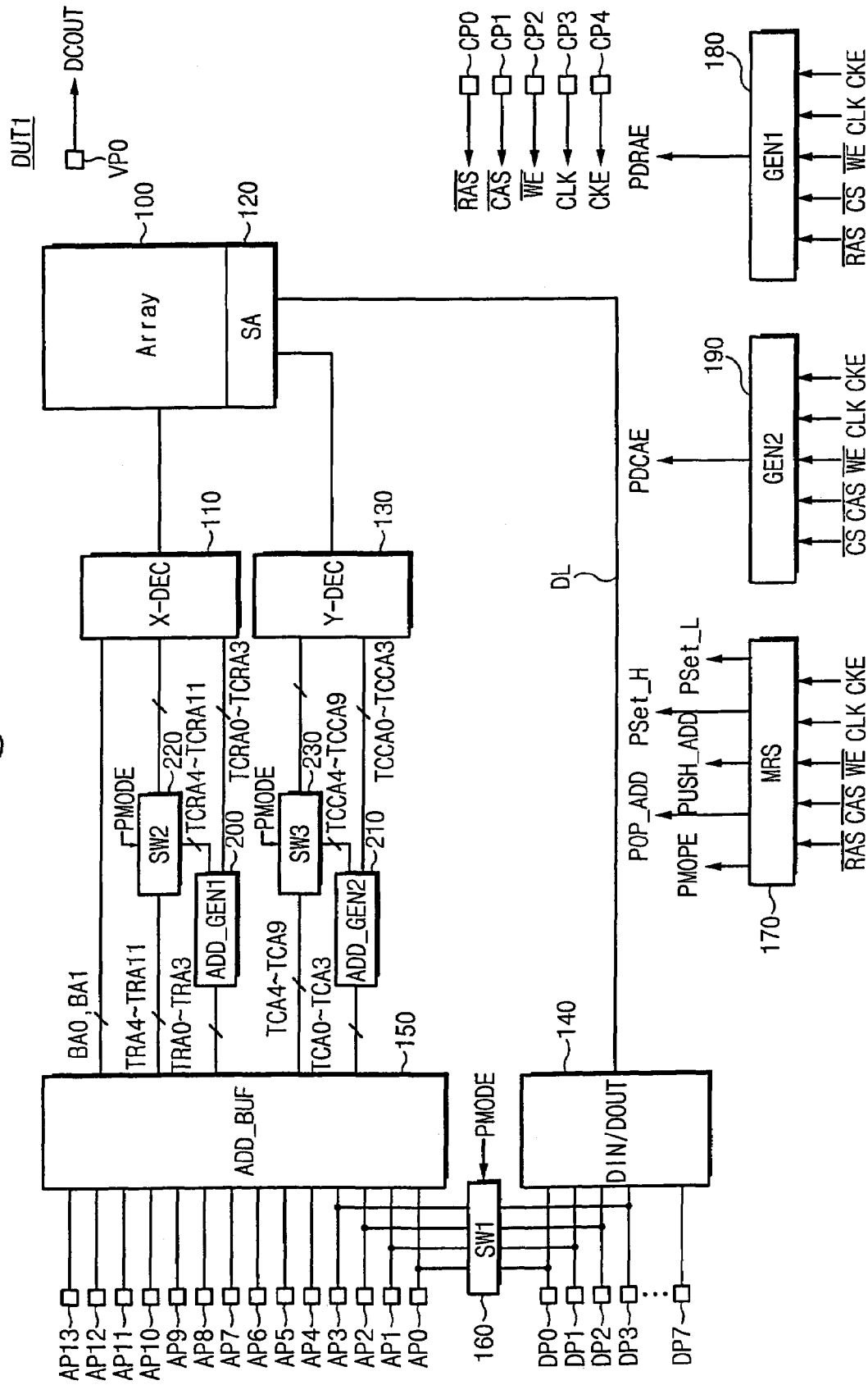
FIG. 3 is a block diagram illustrating a semiconductor memory device of FIG. 2.

FIG. 3 is a block diagram illustrating an example semiconductor memory device DUT1 of FIG. 2. The other memory devices DUT2-DUT4 of FIG. 2 may be configured the same way as DUT1.

Referring to FIG. 3, the semiconductor memory device DUT1 includes a memory cell array 100, which has a plurality of memory cells (not shown) arranged in rows and columns to store data information. Rows of the memory cell array 100 are selected by a row decoder circuit 110 (in this figure, marked by "X-DEC"). Data of the selected memory cells are sensed and amplified by a sense amplifier circuit 120 (in this figure, marked by "SA"). The sensed data is transferred to a data input/output circuit 140 (in this figure, marked by "DIN/DOUT") through data lines DL according to the control of a column decoder circuit 130 (in this figure, marked by "Y-DEC"). The above elements are well known to one skilled in the art.

Continuing to refer to FIG. 3, the semiconductor memory device DUT1 further includes a plurality of address pads AP0-AP13, a plurality of control pads, CP0-CP4, and a plurality of data pads DP0-DP7. The data and address pads can be changed variously according to a memory capacity and a bit organization. Herein, address, control, and data pads or pins are needed for a normal read/write operation.

The address pads AP0-AP13 are connected to an address buffer circuit 150 (in this figure, marked by "ADD_BUF"), and the data pads DP0-DP7 are connected to the data input/output circuit 140. A part of the address pads AP0-AP13 is selectively connected to a part of the data pads DP0-DP7 via a switch circuit 160, which operates responsive to a control signal PMODE from a mode register set circuit 170. The control signal PMODE indicates an operation mode of a semiconductor memory device. For example, the control signal PMODE is activated during a test mode of operation, and the address pads AP0-AP3 are electrically connected to the data pads DP0-DP3. The control signal PMODE is deactivated during a normal mode of operation, and the address pads AP0-AP3 are electrically isolated from to the data pads DP0-DP3. Herein, during the test mode of operation, the address pads AP0-AP3 are used as data pads and address pads, which will be more fully described below.

The semiconductor memory device DUT1 further includes a mode register set circuit 170 (in this figure, marked by "MRS") and signal generators 180 and 190 (in this figure, marked by "GEN1" and "GEN2").

The mode register set circuit 170 operates responsive to external control signals /RAS, /CAS, /WE, CLK and CKE input via the control pads CP0-CP4 and generates control signals PMODE, POP_ADD, PUSH_ADD, PSet_H, and PSet_L for defining various functions required during a wafer test mode of operation. These functions will be more fully described below. The control signal PMODE indicates a wafer level test mode of operation, the control signals POP_ADD and PUSH_ADD are used to store and output an internally generated address, and the control signals PSet_H and PSet_L are used to set an initial address (or a new address during an interval where a test operation is carried out).

The signal generator 180 produces a control signal PDRAE in response to an active command, which is determined by combination of /RAS, /CS, /WE, CLK and CKE signals. For example, when the /CS and /RAS signals are at a low level and the CKE and /WE signals are at a high level, the signal generator 180 produces the control signal PDRAE of a pulse shape in synchronization with a low-high transition of the clock signal CLK. Activation of the control signal PDRAE means that a row address is input together with the active command.

The signal generator 190 produces a control signal PDCAE in response to a read/write command, which is determined by combination of /CAS, /CS, /WE, CLK and CKE signals. For example, when the /CS and /CAS signals are at a low level and the CKE and /WE signals are at a high level, the signal generator 190 produces the control signal PDCAE of a pulse shape in synchronization with a low-high transition of the clock signal CLK. When the /WE, /CS and /CAS signals are at a low level and the CKE signal is at a high level, the signal generator 190 produces the control signal PDCAE of a pulse shape in synchronization with a low-high transition of the clock signal CLK. This is an input timing of a write command. Thus, activation of the control signal PDCAE means that a column address is input together with the read/write command.

Herein, the /CS signal is maintained low at a wafer level test mode of operation.

The semiconductor memory device DUT1 further includes first and second internal address generator circuits 220 and 210 (in this figure, marked by "ADD_GEN1" and "ADD_GEN2") and switch circuits 220 and 230 (in this figure, marked by "SW2" and "SW3"). Bank address signals BA0 and BA1 from the address buffer circuit 150 are sent directly to the row decoder circuit 110.

The internal address generator circuit 200 receives address signals TRA0-TRA3 from the address buffer circuit 150. The internal address generator circuit 200 transfers the received address signals TRA0-TRA3 to the row decoder circuit 110 without modification at a normal mode of operation. The internal address generator circuit 200 generates internal address signals TCRA0-TCRA11 in response to the received address signals TRA0-TRA3 at a test mode of operation. During the test mode of operation, the received address signals TRA0-TRA3 are recognized as a jump command, which will be more fully described below.

The switch circuit 220 transfers address signals TRA4-TRA11 from the address buffer circuit 150 or address signals TCRA4-TCRA11 from the internal address generator circuit 200 to the row decoder circuit 110 in response to the control signal PMODE. For example, during the normal mode of operation, the switch circuit 220 transfers the address signals TRA4-TRA11 from the address buffer circuit 150 to the row decoder circuit 110. During the test mode of operation, the switch circuit 220 transfers the address signals TCRA4-TCRA11 from the internal address generator circuit 200 to the row decoder circuit 110.

The internal address generator circuit 210 receives address signals TCA0-TCA3 from the address buffer circuit 150. The internal address generator circuit 210 transfers the received address signals TCA0-TCA3 to the column decoder circuit 130 without modification during the normal mode of operation. The internal address generator circuit 210 generates internal address signals TCCA0-TCCA9 in response to the received address signals TCA0-TCA3 during the test mode of operation. At the test mode of operation, the received address signals TCA0-TCA3 are recognized as a jump command, which will be more fully described below.

The switch circuit 230 transfers address signals TCA4-TCA9 from the address buffer circuit 150 or address signals TCCA4-TCCA9 from the internal address generator circuit 210 to the column decoder circuit 130 in response to the control signal PMODE. For example, during the normal mode of operation, the switch circuit 230 transfers the address signals TCA4-TCA9 from the address buffer circuit 150 to the column decoder circuit 130. During the test mode of operation, the switch circuit 230 transfers the address signals TCCA4-TCCA9 from the internal address generator circuit 210 to the column decoder circuit 130.

As understood from the above description, twelve pins (six address pins, five control pins and one voltage measurement pin) are used to test a memory device at a wafer level.

Figure 4:
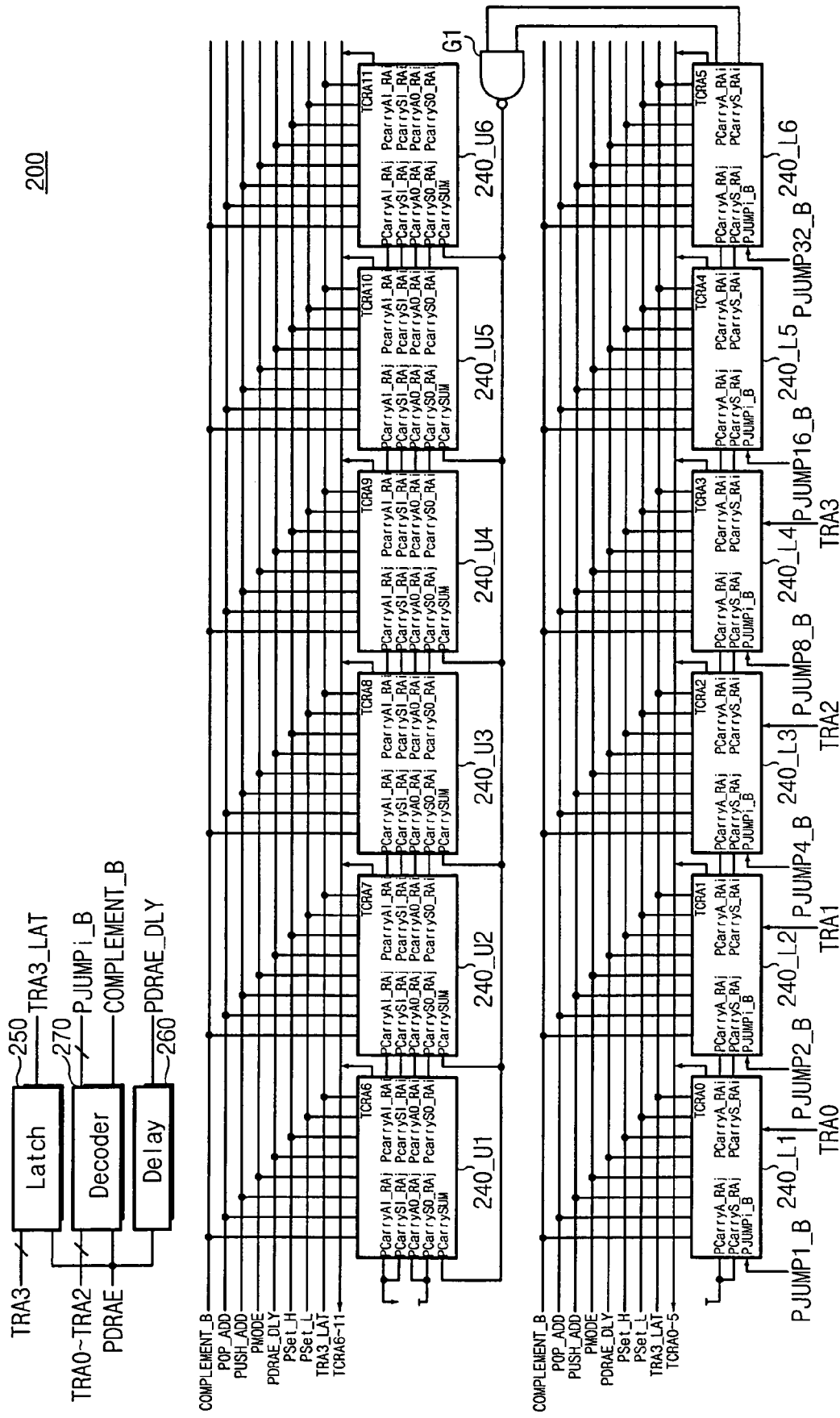
FIG. 4 is a block diagram illustrating an internal address generator circuit of FIG. 3.

FIG. 4 is a block diagram illustrating an example internal address generator circuit 200 of FIG. 3. Referring to FIG. 4, the internal address generator circuit 200 includes a latch circuit 250, a delay circuit 260, a decoder circuit 270, a NAND gate G1, and a plurality of address signal generators 240_L1, 240_L2, . . . 240_L6, and 240_U1, 240_U2, . . . 240_U6.

Figure 5:
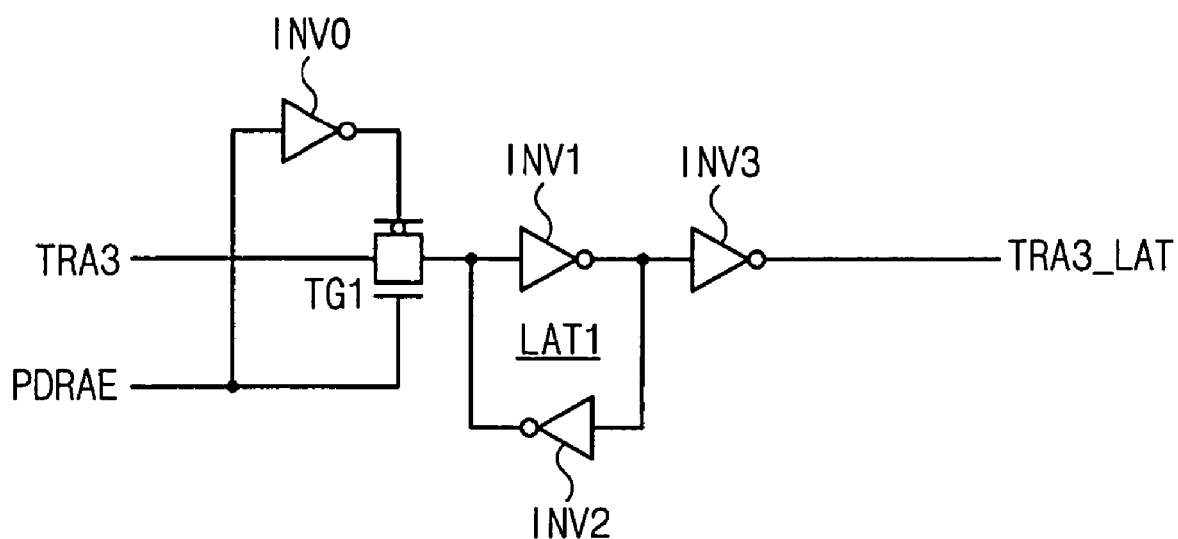
FIG. 5 is a circuit diagram illustrating a latch circuit of FIG. 4.

FIG. 5 is a circuit diagram illustrating an example latch circuit 250 of FIG. 4. The latch circuit 250 latches and outputs an address signal TRA3, which is used as a select signal for selecting whether each address signal generator operates as an adder or as a subtracter at the test mode of operation. As illustrated in FIG. 5, the latch circuit 250 includes a transmission gate TG1, a latch LAT1 consisting of inverters INV1 and INV2, and inverters INV0 and INV3.

When a control signal PDRAE is at a high level, the address signal TRA3 from an address buffer circuit 150 is latched by the latch LAT1.

Returning to FIG. 4, the delay circuit 260 delays the control signal PDRAE to output a delay control signal PDRAE_DLY. The decoder circuit 270 decodes address signals TRA0-TRA2 in response to the control signal PDRAE and outputs jump signals PJUMPi_B (i=1, 2, 4, 8, 16, 32) and a complement signal COMPLEMNT_B.

For example, when a jump signal PJUMP1_B is activated a row address region is shifted in a row direction from a presently selected region by 1, and when a jump signal PJUMP2_B is activated a row address region is shifted in a row direction from a presently selected region by 2. Similarly, when a jump signal PJUMP4_B is activated a row address region is shifted in a row direction from a presently selected region by 4, and when a jump signal PJUMP8_B is activated a row address region is shifted in a row direction from a presently selected region by 8. When a jump signal PJUMP32_B is activated, a row address region is shifted in a row direction from a presently selected region by 32. When the complement signal COMPLEMNT_B is activated, address signals corresponding to a presently selected region are inverted.

Figure 6:
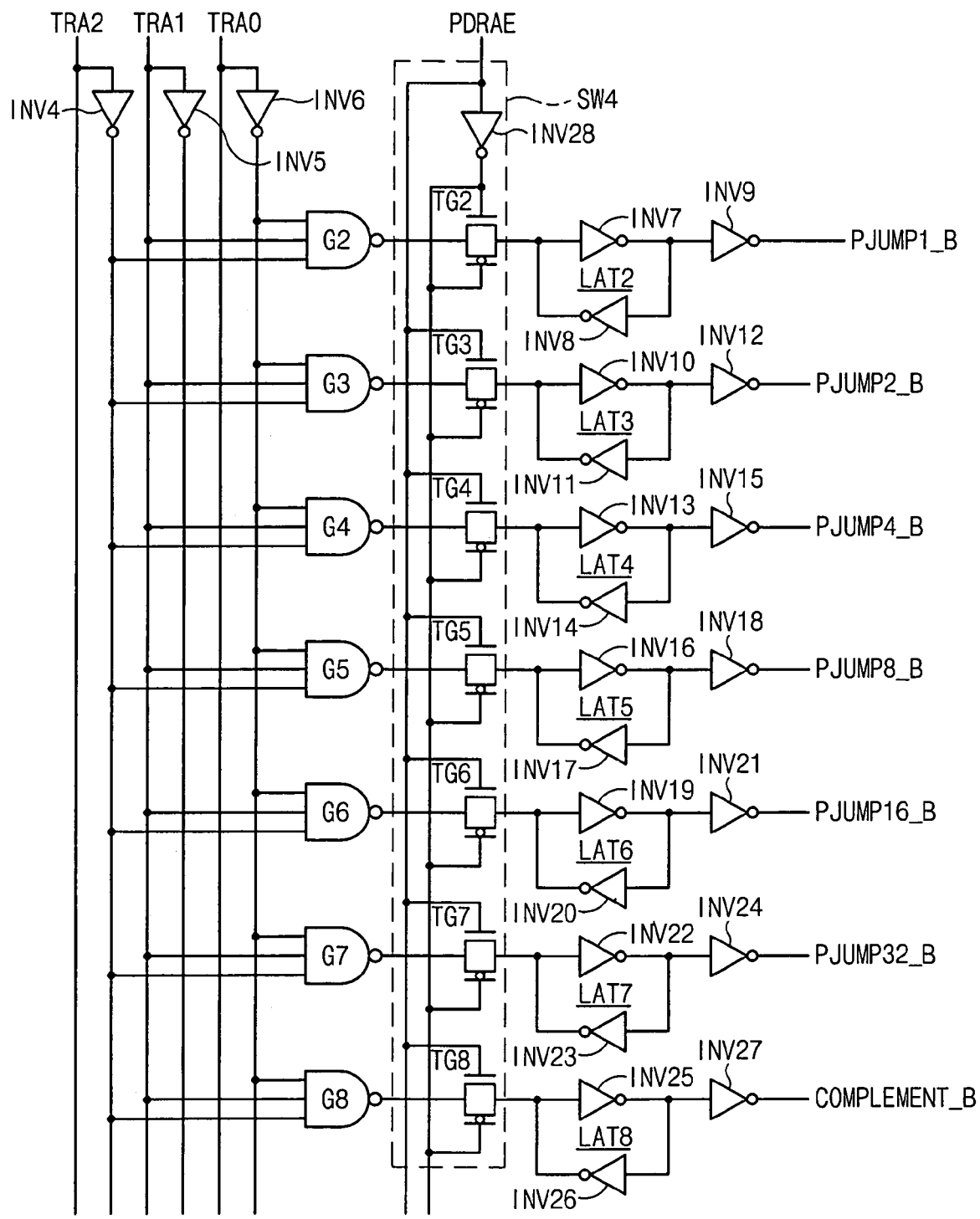
FIG. 6 is a circuit diagram illustrating a decoder circuit of FIG. 4.

FIG. 6 is a circuit diagram illustrating an example decoder circuit 270 of FIG. 4. Referring to FIG. 6, the decoder circuit 270 includes a plurality of inverters INV4-INV27, a plurality of NAND gates G2-G8, and a switch SW4, which are connected as illustrated in this figure. The switch SW4 includes an inverter INV28 and transmission gates TG2-TG8 each corresponding to the NAND gates G2-G8, which are connected as illustrated in this figure. When a control signal PDRAE is at an inactive state, no path of the switch SW4 is formed. When the control signal PDRAE is activated, the path of the switch SW4 is formed and one of the jump and complement signals PJUMP1_B-PJUMP32_B and COMPLEMENT_B is activated. The activation relationship of the jump and complement signals according to the address signals is shown below in table 1.

TABLE 1

| TRA2 | TRA1 | TRA0 | |
|---|---|---|---|
| 0 | 0 | 0 | STAY |
| 0 | 0 | 1 | PJUMP1_B |
| 0 | 1 | 0 | PJUMP2_B |
| 0 | 1 | 1 | PJUMP4_B |
| 1 | 0 | 0 | PJUMP8_B |
| 1 | 0 | 1 | PJUMP16_B |
| 1 | 1 | 0 | PJUMP32_B |
| 1 | 1 | 1 | COMPLEMENT_B |

When address signals TRA2, TRA1 and TRA0 are "000", jump signals PJUMP1_B-PJUMP32_B and a complement signal COMPLEMENT_B remain in an inactive state. This means that the current internal address signals are maintained without modification. When the address signals TRA2, TRA1 and TRA0 are "001", the jump signal PJUMP1_B is activated. It indicates that a current location is shifted or moved in a row or column direction by 1. When the address signals TRA2, TRA1 and TRA0 are "010", the jump signal PJUMP2_B is activated. It indicates that a current location is shifted or moved in a row or column direction by 2. Likewise, the other combination of the address signals makes a moving/jump operation performed in the same manner as described above. When the address signals TRA2, TRA1 and TRA0 are "111", the complement signal COMPLEMENT_B is activated. It indicates that the present internally generated address signals are inverted.

Returning to FIG. 4, each of the address signal generators 240_L1-240_L6 and 240_U1-240_U6 is commonly supplied with control signals POP_ADD, PUSH_ADD, PMODE, PSet_H, and PSet_L from the mode register set circuit 170 and output signals TRA3_LAT, PDRAE_DLY, and COMPLEMENT_B from the latch, delay, and decoder circuits 210, 220, and 230. As described above, the control signal PMODE denotes a wafer level test mode of operation, the control signals POP_ADD and PUSH_ADD are used to store internally generated address signals of the respective address signal generators 240_L1-240_L6 and 240_U1-240_U6, and the control signals PSet_H and PSet_L are used to set an initial address (a new address during a test operation) of the address signal generators 240_L1-240_L6 and 240_U1-240_U6.

As illustrated in FIG. 4, jump signals PJUMP1_B, PJUMP2_B, PJUMP4_B, PJUMP8_B, PJUMP16_B, and PJUMP32_B are applied to the address signal generators 240_L1, 240_L2, 240_L3, 240_L4, 240_L5, and 240_L6, respectively. The address signal generators 240_L1-240_L6 are configured such that an output of an Nth address signal generator is affected by carry signals from a (N−1)th address signal generator together with a corresponding jump signal. The address signal generators 240_U1-240_U6 are configured such that an output of an Nth address signal generator is affected by both carry signals from a (N−1)th address signal generator and an output signal of the NAND gate G1, which will be more fully described below.

Figure 7:
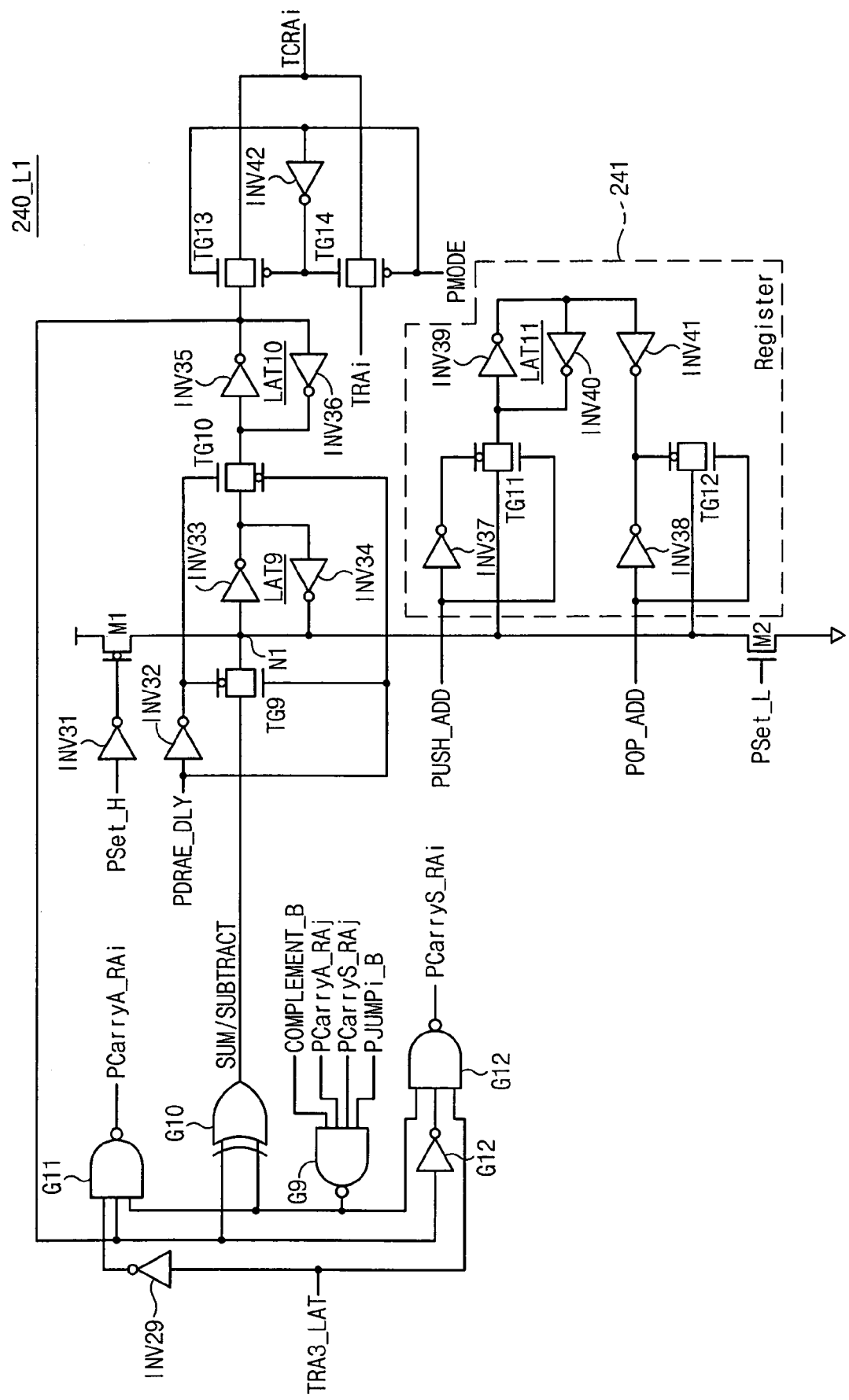
FIG. 7 is a circuit diagram illustrating the address signal generators 240_L1 to 240_L4 of FIG. 4.

FIG. 7 is a circuit diagram illustrating an example address signal generator 240_L1 of FIG. 4. The address signal generators 240_L2, 240_L3, and 240_L4 are configured in the same way as address signal generator 240_L1.

Referring to FIG. 7, when a control signal PMODE is at a low level indicating a normal mode of operation, a transmission gate TG13 does not conduct and a transmission gate TG14 conducts. Thus, an address signal TRAi from the address buffer circuit 150 transferred directly to the row decoder circuit 110.

On the other hand, when the control signal PMODE is at a high level indicating a test mode of operation, the transmission gate TG13 conducts and the transmission gate TG14 does not conduct. This means that direct transmission of the address signal TRAi into the row decoder circuit 110 is interrupted. Instead, an internally generated address signal is transferred to the row decoder circuit 110 via the transmission gate TG13.

A latch LAT9 consisting of inverters INV33 and INV34 is set to 0 or 1 by a reset circuit, which includes a PMOS transistor M1, an NMOS transistor M2, and an inverter INV31. For example, when a control signal PSet_H is activated high and a control signal PSet_L is deactivated low, the latch LAT9 is set to 1 through the PMOS transistor M1. When the control signal PSet_H is deactivated low and the control signal PSet_L is activated high, the latch LAT9 (an input node N1 of the latch LAT9) is set to 0 via the NMOS transistor M2. A stored value in the latch LAT9 is transferred to a latch LAT10 when a control signal PDRAE_DLY transitions from a high level to a low level. The latches LAT9 and LAT10, the inverter INV32, and the transmission gates TG9 and TG10 constitute a register which latches an input at a low-high transition of the control signal PDRAE_DLY and outputs a latched signal at a high-low transition of the control signal PDRAE_DLY.

An address signal stored in the latch LAT9 is temporarily stored in a register 241, which includes inverters INV37, INV38, and INV41, transmission gates TG11 and TG12, and a latch LAT11 consisting of inverters INV39 and INV40. When a control signal PUSH_ADD is activated high, an address signal stored in the latch LAT9 is stored in a latch LAT11 via the transmission gate TG11. When a control signal POP_ADD is activated high, an address signal stored in the latch LAT11 is transferred to the latch LAT9 via the transmission gate TG12. That is, the latch LAT9 is set to an address signal stored in the register 241. It means that an address to be used afterward is stored in the register 241.

An NAND gate G9 receives carry signals PCarryA_RAj and PCarryS_RAj, a corresponding jump signal PJUMPi_B (i=1) and a complement signal COMPLEMENT_B. Carry signals PCarryA_RAj and PCarryS_RAj of the address signal generator 240_L1 are fixed to a high level as illustrated in FIG. 4. On the other hand, carry signals PCarryA_RAj and PCarryS_RAj for each of the remaining address signal generators 240_L2-240_L6 are carry signals PCarryA_RAi and PCarryS_RAi from a previous stage. When the carry signals PCarryA_RAj and PCarryS_RAj, a corresponding jump signal PJUMPi_B, and a complement signal COMPLEMENT_B are all at a high level, an output of a NAND gate G9 goes low. If one of input signals to the NAND gate G9 becomes low, an output of the NAND gate G9 transitions from a low level to a high level. Accordingly, the NAND gate G9 acts as a circuit for detecting whether a carry is made from a previous stage or whether a jump/complement signal PJUMPi_B/COMPLEMENT_B is activated.

An exclusive OR gate G10 receives an output of the latch LAT10 and an output of the NAND gate G9 to generate an output signal SUM/SUBTRACT. A NAND gate G11 generates a carry signal PCarryA_RAi in response to outputs of the latch LAT10, the NAND gate G9, and the inverter INV29. A NAND gate G12 produces a carry signal PCarryS_RAi in response to an address signal TRA3_LAT and outputs of the NAND gate G9 and the inverter INV30. The gates G10 and G11 act as an adder. The gate G10, the inverter INV30, and the NAND gate G12 act as a subtracter. That is, the gates G9, G10, G12, and the inverter INV30 constitute an add/subtract circuit. Selection of add and subtraction functions is determined by the TRA3_LAT signal. For example, when the TRA3_LAT is at a low level, the add/subtract circuit operates as an adder. When the TRA3_LAT is at a high level, the add/subtract circuit acts as a subtracter. An address increases when the add/subtract circuit operates as an adder and decreases when the add/subtract circuit acts as a subtracter.

Figure 8:
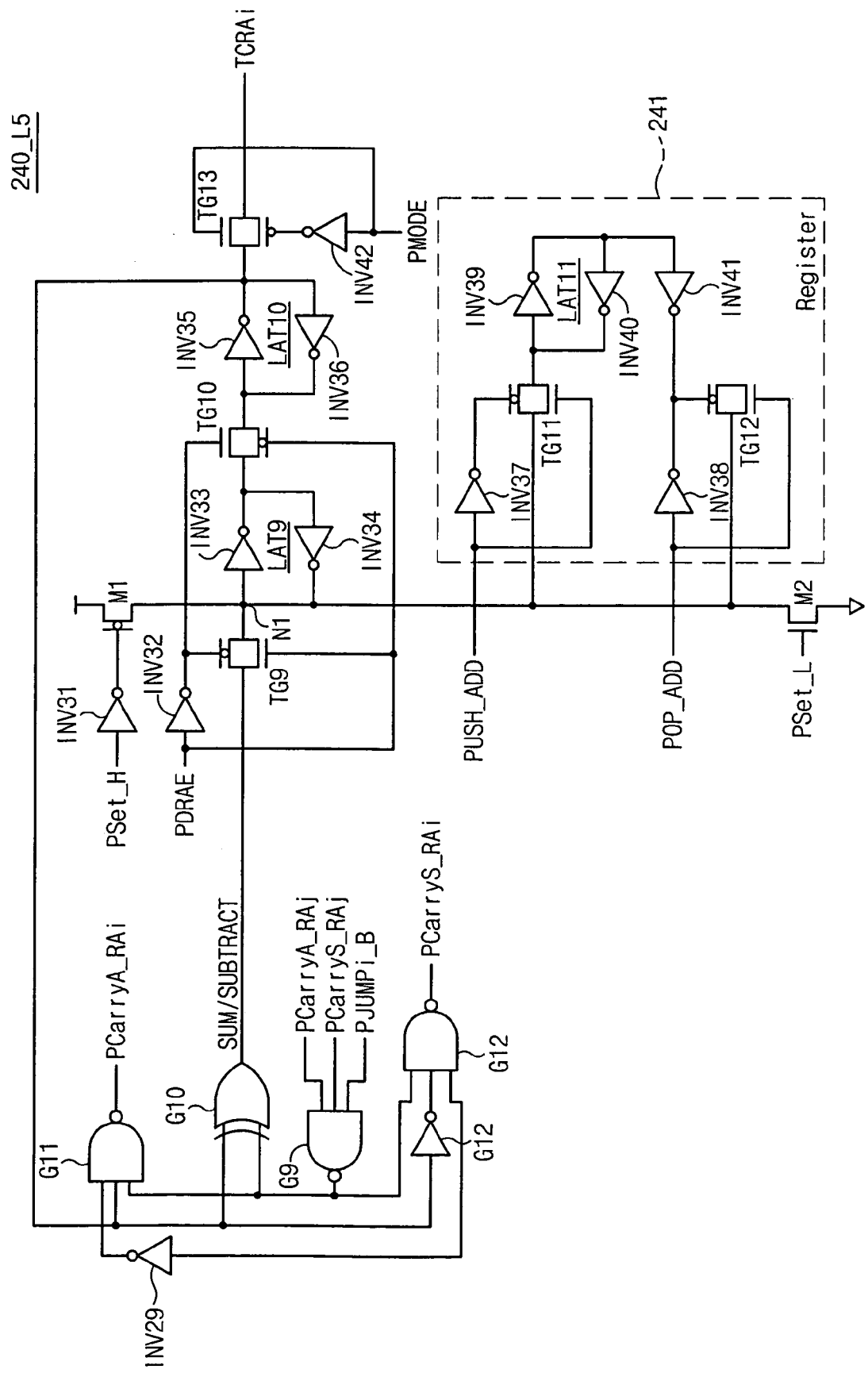
FIG. 8 is a circuit diagram illustrating the address signal generators 240_L5 and 240_L6 of FIG. 4.

FIG. 8 is a circuit diagram illustrating an example address signal generator 240_L5 of FIG. 4. The address signal generator 240_L6 is configured in the same way as 240_L5. In FIG. 8, constituent elements that are the same as those in FIG. 7 are marked by the same references. An address signal generator in FIG. 8 is equal to that in FIG. 7 except that a transmission gate TG15 is removed, thus a duplicative description is omitted.

During a test mode of operation, an internally generated address signal is sent to a row decoder circuit 110 via a transmission gate TG13 and a switch circuit 220. Since the transmission gate TG13 does not conduct during a normal mode of operation, the address signal generator is electrically isolated from the switch circuit 220.

Returning to FIG. 4, each of address signal generators 240_U1-240_Ui is affected by carry signals PCarryA_RAi and PCarryS_RAi of the address signal generator 240_L6. The address signal generators 240_U1-240_U6 internally generate two address signals depending on whether the address signal generator 240_L6 generates carry signals PCarryA_RAi and PCarryS_RAi. One of the internally generated address signals is issued according to an output signal PCarrySUM of the NAND gate G1. This will be more fully described below.

Figure 9:
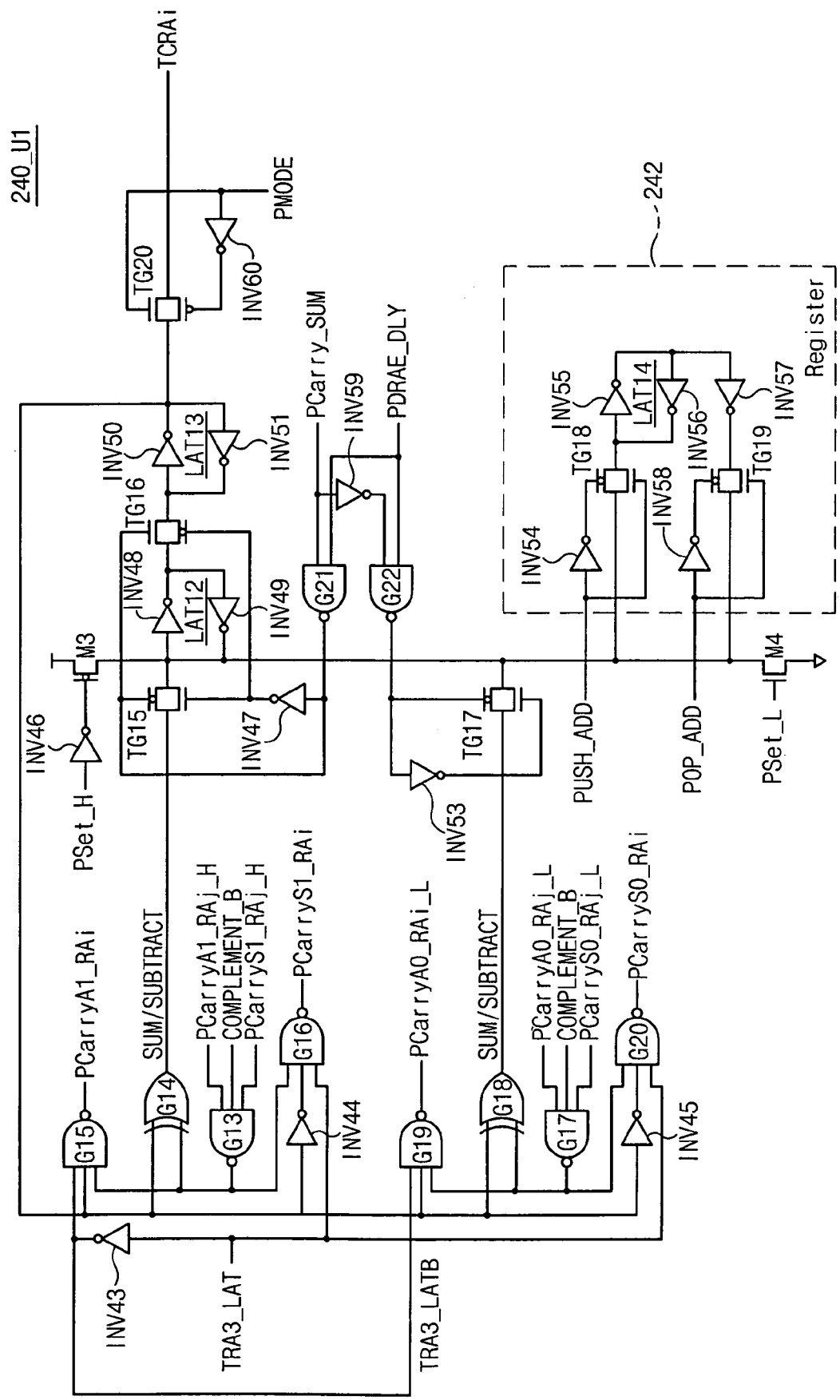
FIG. 9 is a circuit diagram illustrating the address signal generators 240_U1 to 240_U6 of FIG. 4.

FIG. 9 is a circuit diagram illustrating an example address signal generator 240_U1 of FIG. 4. The remaining address signal generators 240_U2-240_U6 of FIG. 4 are configured in the same way as 240_U1.

Referring to FIG. 9, when a control signal PMODE is at a low level indicating a normal mode of operation, a transmission gate TG20 does not conduct and an address signal generator is electrically connected to a switch circuit 220. When the control signal PMODE is at a high level indicating a test mode of operation, an internally generated address signal is sent to a row decoder circuit 110 via a transmission gate TG20 and the switch circuit 220.

A latch LAT12 consisting of inverters INV48 and INV49 is set to 0 or 1 by a reset circuit which includes a PMOS transistor M3, an NMOS transistor M4, and an inverter INV46. For example, when a control signal PSet_H is activated high and a control signal PSet_L is deactivated low, the latch LAT12 is set to 1 through the PMOS transistor M3. When the control signal PSet_H is deactivated low and the control signal PSet_L is activated high, the latch LAT12 is set to 0 via the NMOS transistor M4. A stored value in the latch LAT12 is transferred to a latch LAT13 of inverters INV50 and INV51 depending on the output signal of NAND gate G21.

An address signal stored in the latch LAT12 is temporarily stored in a register 242, which includes inverters INV54, INV57, and INV58, transmission gates TG18 and TG19, and a latch LAT14 consisting of inverters INV55 and INV56. When a control signal PUSH_ADD is activated high, an address signal stored in the latch LAT12 is stored in the latch LAT14 via the transmission gate TG18. When a control signal POP_ADD is activated high, an address signal stored in the latch LAT14 is transferred to the latch LAT12 via the transmission gate TG19. That is, the latch LAT12 is reset to an address signal stored in the register 242.

A NAND gate G13 receives carry signals PCarryA1_RAj and PCarryS1_RAj and a complement signal COMPLEMENT_B. Carry signals PCarryA1_RAj and PCarryS1_RAj of an address signal generator 240_U1 are fixed to a low level as illustrated in FIG. 4. On the other hand, carry signals PCarryA1_RAj and PCarryS1_RAj for each of the remaining address signal generators 240_U2-240_U6 are carry signals PCarryA1_RAi and PCarryS1_RAi from the previous stage. In case of an address signal generator 240_U1, since carry signals PCarryA1_RAj and PCarryS1_RAj are at a low level, an output of the NAND gate G13 is fixed to a high level. In the case of the other address signal generators 240_U2-240_U6, an output of the NAND gate G13 is determined by the carry signals PCarryA1_RAj and PCarryS1_RAj from the previous stage and a complement signal COMPLEMENT_B. As described above, the NAND gate G13 acts as a circuit for detecting whether a carry is made from a previous stage or whether a complement signal COMPLEMENT_B is activated.

An exclusive OR gate G14 receives outputs of the latch LAT10 and the NAND gate G13 to generate an output signal SUM/SUBTRACT. A NAND gate G15 generates a carry signal PCarryA1_RAi in response to outputs of the latch LAT13, the NAND gate G13, and the inverter INV43. A NAND gate G16 produces a carry signal PCarryS1_RAi in response to an address signal TRA3_LAT and outputs of the NAND gate G13 and the inverter INV44. The gates G14 and G15 act as an adder, and the gates G14, G16, and the inverter INV44 act as a subtracter. Selecting between an adder and a subtracter is determined by the TRA3_LAT signal. For example, when the TRA3_LAT is at a low level, the add/subtract circuit operates as an adder. When the TRA3_LAT is at a high level, the add/subtract circuit operates as a subtracter.

An add/subtract circuit consisting of gates G17-G20 and an inverter INV45 operates the same as that consisting of gates G13-G16 and an inverter INV44 except for the following. The add/subtract circuit G17-G20 and INV45 operates under the assumption that an address signal generator 240_L6 produces no carry, and the add/subtract circuit G13-G16 and INV44 operates under the assumption that the address signal generator 240_L6 produces a carry. That is, since carry signals PCarryA0_RAj and PCarryS0_RAj are fixed to a high level as illustrated in FIG. 4, the add/subtract circuit G13-G16 and INV44 operates under the assumption that the address signal generator 240_L6 produces a carry.

When an output signal PCarrySUM of a NAND gate G1 in FIG. 4 is at a low level, no carry is generated by the address signal generator 240_L6, a transmission gate TG15 does not conduct and thus an output signal SUM/SUBTRACT of the gate G14 is not transferred to the latch LAT12. On the other hand, a transmission gate TG17 conducts when a control signal PDRAE_DLY has a low-high transition, transferring the output signal SUM/SUBTRACT of the gate G14 to the latch LAT12.

Figure 10:
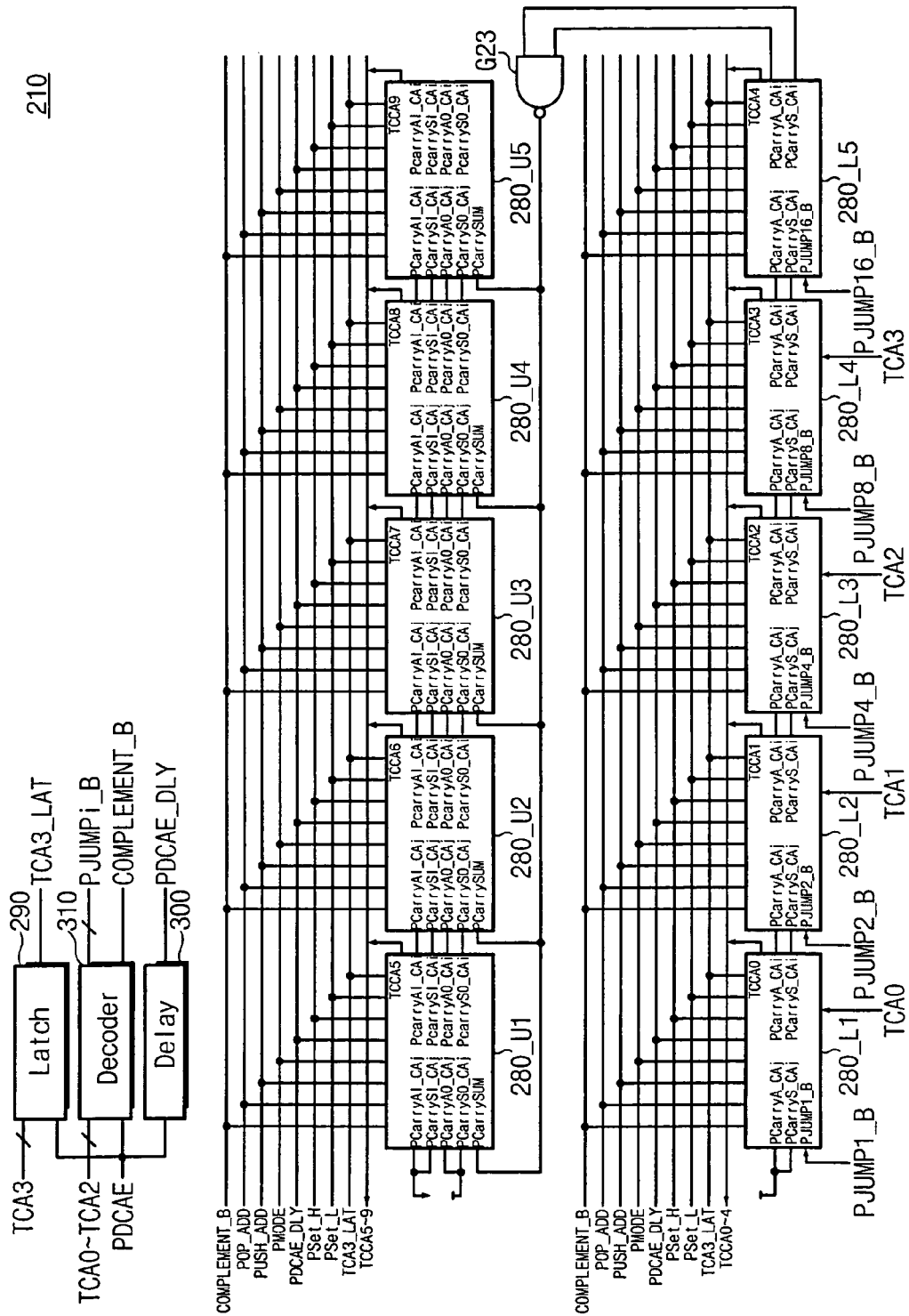
FIG. 10 is a circuit diagram illustrating an internal address generator circuit of FIG. 3.

FIG. 10 is a block diagram illustrating an example internal address generator circuit 210 of FIG. 3. Referring to FIG. 10, the internal address generator circuit 210 includes a latch circuit 290, a delay circuit 300, a decoder circuit 310, a NAND gate G23, and a plurality of address signal generators 280_L1-280_L5 and 280_U1-280_U5. The operation of internal address generator circuit 210 in FIG. 10 is identical to the internal address generator circuit 200 of FIG. 4 except that a 10-bit column address is generated. Accordingly, a duplicative description is omitted.

A read/write operation of a test mode according to embodiments of the invention will now be more fully described with reference to the accompanying drawings, and in particular to FIGS. 2 and 3.

In order to test a semiconductor memory device at a wafer level, a part (in this embodiment, AP0-AP3, AP12 and AP13) of address pads, control pads CP0-CP4 and a voltage measurement pad CP0 are connected to corresponding channels of a tester 10. That is, as illustrated in FIG. 2, twelve channels are assigned to a memory device to be tested. Thus, four semiconductor memory devices are simultaneously connected to the tester 10.

Afterwards, a mode register set circuit 170 is set to a test mode according to a predetermined timing, so that a control signal PMODE goes to a high level. This enables switch circuits 160, 220, and 230 to be activated. Address pads AP0-AP3 connected to the tester 10 are connected to data pads DP0-DP3 via the switch circuit 160. The switch circuit 220 connects address signal lines TCRA4-TCRA11 of an internal address generator circuit 200 to a row decoder circuit 110, and the switch circuit 230 connects address signal lines TCCA4-TCCA9 of an internal address generator circuit 210 to a column decoder circuit 130.

Control signals PSet_H and PSet_L can be variously established when setting the mode register set circuit 170. As described above, the control signals PSet_H and PSet_L are used to set latches LAT9 and LAT12 of address signal generators in each of the internal address generator circuits 200 and 210. Assume that the control signal PSet_H is set to a low level and the control signal PSet_L is set to a high level. As the control signal PSet_L is activated high, the latches LAT9 and LAT12 of address signal generators in each internal address generator circuit are set to a low level, respectively. Accordingly, output signals TCRA0-TCRA11 of the internal address generator circuit 200 become low. Likewise, output signals TCCA0-TCCA9 of the internal address generator circuit 210 become low. If the control signal PSet_H is set to a high level and the control signal PSet_L is set to a low level, the latches LAT9 and LAT12 of address signal generators in each internal address generator circuit are set to a low level, respectively. Accordingly, output signals TCRA0-TCRA11 of the internal address generator circuit 200 become high. Likewise, output signals TCCA0-TCCA9 of the internal address generator circuit 210 become high.

After setting the mode register set circuit 170, row address signals are provided to the memory device together with an active command. A row address provided at a test mode is a 6-bit address. For some embodiments of the present invention, as described above, two address bits are bank information and four address bits are a jump command. The bank information is sent directly to a row decoder circuit 110 through an address buffer circuit 150. At the same time, as the active command is received, a signal generator circuit 180 generates a control signal PDRAE of a pulse shape in response to external control signals /RAS, /CS, /WE, CLK and CKE. As the control signal PDRAE is activated, a latch circuit 250 in the internal address generator circuit 200 latches an address signal TRA3, which is delayed by a delay circuit 260. A decoder circuit 270 in the internal address generator circuit 200 latches address signals TRA0-TRA3 from the address buffer circuit 150. Jump and complement signals are selectively activated according to combination of address signals latched by the decoder circuit 270.

For example, when the address signals TRA0-TRA3 is "0000", as shown in table 1, address signals TCRA0-TCRA11 are maintained at present values. A detailed description is as follows.

Referring to FIGS. 7 and 8, since the latch LAT9 is set to a low level, an input terminal of an XOR gate G10 becomes low. Since carry signals PCarryA_RAj and RCarryS_RAj of a first stage address signal generator 240_L1 are connected to a power supply voltage and jump and complement signals PJUMP1_B and COMPLEMENT_B are deactivated high, an output of the NAND gate G9 goes to a low level. When a TRA3_LAT signal is at a low level, an add/subtract circuit operates as an adder. An output PCarryS_RAi of a NAND gate G12 is maintained high. Since the output of the NAND gate G9 is at a low level, an output of a NAND gate G11 is maintained high. At this time, an output signal SUM/SUBTRACT of an XOR gate G10 becomes low. In case of an address signal generator 240_L2, since carry signals PCarryA_RAj and PCarryS_RAj of a previous stage are maintained high and the jump and complement signals PJUMP2_B and COMPLEMENT_B are deactivated high, an output of an XOR gate G10 turns to a low level. Likewise, an output of an XOR gate G10 in each of address signal generators 240_L3-240_L6 becomes low.

Since carry signals PCarryA_RAj and PCarryS_RAj from the address signal generator 240_L6 are high, an output signal PCarrySUM of a NAND gate G1 (see FIG. 4) has a low level indicating that no carry is generated.

In the address signal generators 240_U1-240_U6 (see FIG. 9), since the output signal PCarrySUM of the NAND gate G1 has a low level, no path of a transmission gate TG15 is formed. An output signal of a NAND gate G17 goes low because its input signals all are high. Accordingly, an output signal SUM/SUBTRACT of an XOR gate G18 becomes low.

In the case of address signal generator 240_U2, since carry signals PCarryA1_RAj, PCarryS1_RAj, PCarryA0_RAj and PCarryS0_RAj of a previous stage are maintained high and the complement signal COMPLEMENT_B is deactivated high, an output of the XOR gate G18 turns to a low level. Likewise, an output of the XOR gate G18 in each of address signal generators 240_U3-240_U6 becomes low.

When an output signal PDRAE_DLY of a delay circuit 260 is activated high, an output signal of an XOR gate G10 in each of address signal generators 240_L1-240_L6 is stored in a latch LAT9, and an output signal of an XOR gate G18 in each of address signal generators 240_U1-240_U6 is stored in a latch LAT12. In conclusion, when an address signal for TRA0-TRA2 of 000 is received, values of latches LAT9 and LAT12 are maintained at initially set values. Afterward, when an output signal PDRAE_DLY is deactivated low, a part TCRA0-TCRA3 among output signals of the internal address generator circuit 200 is transferred directly to a row decoder circuit 110 and the other signals TCRA4-TCRA11 are sent to the row decoder circuit 110 via the switch circuit 220.

After the active command is received, column address signals are provided to the memory device together with a read/write command. A column address provided at a test mode is a 4-bit address except for bank information. As described above, the 4-bit address is used as a jump command. The address signals TCA0-TCA3 received as a jump command are latched by the internal address generator circuit 210 when a control signal PDCAE is activated. Afterward, an operation of generating internal address signals TCCA0-TCCA9 is identical to that of the internal address generator circuit 200, and a duplicative description is omitted.

The row decoder circuit 110 selects a row of a memory cell array 100 using internal address signals TCRA0-TCRA11 internally generated according to an input of an active command, and data stored in memory cells of the selected row are sensed by a sense amplifier circuit 120. Then, a column decoder circuit 130 selects a part of columns of the memory cell array 100 using internal address signals TCCA0-TCCA9 internally generated according to an input of a read command. Data on the selected columns is transferred to address pads AP0-AP3 via a data input/output circuit 140 and a switch circuit 160, and the tester 10 fetches data on the address pads AP0-AP3. Since data is output through four pads, a bit organization of X8/X16 can be realized using a serial data input/output manner. For example, four data bits are outputted via address pads two/four times. In the case where a write command is received after an active command, data to be written in the memory cell array 100 is provided to the data input/output circuit 140 via four address pads using a serial data input/output manner, and data thus received is written in selected memory cells (selected by internally generated address signals TRCA0-TRCA11 and TCCA0-TCCA9) through the sense amplifier circuit 120. A write/read operation is performed and then a precharge operation is made.

An above-described read/write operation is repeated to write or read data in or from all memory cells at a test mode. For the next write/read operation, active and read/write commands are provided to a memory device according to a predetermined timing. Since the internal address generator circuit 210 for generating a column address operates the same as the internal address generator circuit 200 for generating a row address, only the operation of generating a row address will be described below.

Assume that address signals TRA3-TRA0 of 0001 are provided together with an active command. When address signals TRA3-TRA0 of 0001, as illustrated in the table 1, a jump signal PJUMP1_B is activated low. As the TRA3 signal is set to a low level, an add/subtract circuit of each address signal generator operates as an adder. As the jump signal PJUMP1_B is activated low, a NAND gate G9 of an address signal generator 240_L1 outputs a high-level signal. An XOR gate G10 outputs a high-level signal SUM/SUBTRACT with an output of a latch LAT10 being "0". At this time, an output signal RCarryA_RAi of a NAND gate G11 is maintained high. That is, no carry is generated from the address signal generator 240_L1. The other address signal generators 240_L2-240_L6 and 240_U1-240_U6 operate at the same conditions as described above, and an XOR gate G10/G14 of each generator outputs a low-level signal SUM/SUBTRACT. Accordingly, a value of an address signal TCRA0 is changed from 0 to 1, and the other address signals TCRA1-TCRA11 are maintained at 0.

When address signals TRA0-TRA3 input with an active command are 1000, a jump signal PJUMP1_B is activated. As the TRA3 signal is set to a low level, an add/subtract circuit of each address signal generator operates as an adder. As the jump signal PJUMP1_B is activated low, a NAND gate G9 of an address signal generator 240_L1 outputs a high-level signal. An XOR gate G10 outputs a low-level signal SUM/SUBTRACT with an output of a latch LAT10 being 1. Thus, a value of a latch LAT9 is changed from 1 to 0. At this time, an output signal PCarryA_RAi of a NAND gate G11 transitions from a high level to a low level. That is, a carry is produced from the address signal generator 240_L1.

An address signal generator 240_L2 is affected by a carry signal from a previous stage. That is, a NAND gate G9 of the address signal generator 240_L2 outputs a high-level signal according to a carry signal PCarryA_RAj of a high level. Since a value of 0 is output from a latch LAT10 of the generator 240_L2, an output signal of a NAND gate G11 is maintained high while an XOR gate G10 outputs a high-level signal SUM/SUBTRACT. Thus, a value of the latch LAT9 in the generator 240_L2 is changed from 0 to 1. Remaining address signal generators 240_L3-240_L6 and 240_U1-240_U6 operate at the same conditions as described above, and an XOR gate G10/G14 of each generator outputs a low-level signal SUM/SUBTRACT. Accordingly, the address signal TCRA0 transitions from 1 to 0 and an address signal TCRA1 transitions from 0 to 1. On the other hand, the other address signals TCRA2-TCRA11 are maintained at 0.

When address signals TRA3-TRA0 input with an active command are 0001, a jump signal PJUMP1_B is activated. As the TRA3 signal is set to a low level, an add/subtract circuit of each address signal generator operates an adder. As the jump signal PJUMP1_B is activated low, a NAND gate G9 of an address signal generator 240_L1 outputs a high-level signal. An XOR gate G10 outputs a high-level signal SUM/SUBTRACT with an output of a latch LAT10 being 0. Thus, a value of a latch LAT9 is changed from 0 to 1. Since all input signals of a NAND gate G11 are at a high level, the address signal generator 240_L1 generates no carry. At this time, output signals of remaining generators are maintained at previous values. Accordingly, an address signal TCRA0 transitions from 0 to 1 while an address signal TCRA1 is maintained at 1 and address signals TCRA2-TCRA11 are maintained at 0.

When address signals TRA3-TRA0 input with an active command are 1001, a jump signal PJUMP1_B is activated. As the TRA3 signal is set to a high level, an add/subtract circuit of each address signal generator operates a subtracter. As the jump signal PJUMP1_B is activated low, a NAND gate G9 of an address signal generator 240_L1 outputs a high-level signal. An XOR gate G10 outputs a low-level signal SUM/SUBTRACT with an output of a latch LAT10 being 1. Thus, a value of a latch LAT9 is changed from 1 to 0. A NAND gate G12 of the address signal generator 240_L1 outputs a high-level signal PCarryS_RAi. That is, no carry is made from the generator 240_L1. At this time, output signals of remaining generators are maintained at previous values. Accordingly, an address signal TCRA0 transitions from 1 to 0 while an address signal TCRA1 is maintained at 1 and address signals TCRA2-TCRA11 are maintained at 0.

Prior to an input of an active command, a mode register set circuit 170 is re-established such that a control signal PUSH_ADD is activated high. As the control signal PUSH_ADD is activated high, values of latches LAT9/LAT12 in respective address signal generators are stored in corresponding registers 241/241'. The stored address TCRA11-TCRA0 becomes "000000000010", which is used in the future.

When address signals TRA3-TRA0 input with an active command are 0110, a jump signal PJUMP32_B is activated. As the TRA3 signal is set to a low level, an add/subtract circuit of each address signal generator operates an adder. As the jump signal PJUMP32_B is activated low, a NAND gate G9 of an address signal generator 240_L6 outputs a high-level signal. An XOR gate G10 outputs a high-level signal SUM/SUBTRACT when the output of the latch LAT10 is 0. Thus, a value of a latch LAT9 is changed from 0 to 1. A NAND gate G11 of the address signal generator 240_L6 outputs a high-level signal PCarryA_RAi. That is, no carry is made from the generator 240_L6. At this time, output signals of remaining generators are maintained at previous values. Accordingly, an address signal TCRA5 transitions from 0 to 1 while an address signal TCRA1 is maintained at 1 and address signals TCRA0, TCRA2-TCRA4, and TCRA6-TCRA11 are maintained at 0. In conclusion, a row address TCRA11-TCRA0 becomes "000000100010".

When address signals TRA3-TRA0 input with an active command are 0110, a jump signal PJUMP32_B is activated. As the TRA3 signal is set to a low level, an add/subtract circuit of each address signal generator operates an adder. As the jump signal PJUMP32_B is activated low, a NAND gate G9 of an address signal generator 240_L6 outputs a high-level signal. An XOR gate G10 outputs a low-level signal SUM/SUBTRACT when the output of the latch LAT10 is 1. Thus, a value of a latch LAT9 is changed from 1 to 0. A NAND gate G11 of the address signal generator 240_L6 outputs a low-level signal PCarryA_RAi. That is, a carry is made from the generator 240_L6.

As an output signal PCarryA_RAi of the address signal generator 240_L6 goes high, a NAND gate G1 outputs a high-level signal. Thus, a transmission gate TG15 of each of the generators 240_U1-240_U6 conducts and a transmission gate TG17 does not conduct. That is, a state of a latch LAT12 is determined not by an output signal of an XOR gate, but by an output signal of an XOR gate G14. As illustrated in FIG. 4, since carry signals PCarryA1_RAj and PCarryS1_RAj of the generator 240_U1 are connected to a ground voltage, a NAND gate G13 outputs a high-level signal. This makes the XOR gate G14 output a high-level signal SUM/SUBTRACT. Accordingly, a value of the latch LAT12 is changed from 0 to 1. Output signals of the remaining generators 240_L1-240_L5 and 240_U2-240_U6 are maintained at previous values. Accordingly, an address signal TCRA5 transitions from 1 to 0 and an address signal TCRA6 transitions from 0 to 1. In conclusion, a row address TCRA11-TCRA0 becomes "000001000010".

When address signals TRA3-TRA0 input with an active command are 1111, as shown in the table 1, a complement signal COMPLEMENT_B is activated. As the complement signal COMPLEMENT_B is activated low, a NAND gate G9/G13 of each generator outputs a high-level signal. For example, when a previous address signal has a low level, an XOR gate G11/G14 outputs a high-level signal, making a value of a latch LAT9/12 change from 0 to 1. When a previous address signal has a high level, an XOR gate G10/G14 outputs a low-level signal, making a value of a latch LAT9/12 change from 1 to 0. Accordingly, a presently generated address is an inverted version of a previously generated address. For example, assuming that a previous address TCRA11-TCRA0 is "000001000010", a present address TCRA11-TCRA0 becomes "111110111101" when the complement signal COMPLEMENT_B is activated low.

Prior to an input of an active command, a mode register set circuit 170 is re-established such that a control signal POP_ADD is activated high. As the control signal POP_ADD is activated high, a value in a register 241/241' of each address signal generator is transferred to a corresponding latch LAT9/LAT12. For example, in the case where a value stored in registers is "000000100010" and a previously generated address TCRA11-TCRA0 is "111110111101", Values of latches LAT9 and LAT12 are changed from 111110111101 to 000000100010.

A row address variation according to the above description is as follows.

TABLE 2

| A3-A0 | MRS | TCA11-TCA0 | |
|---|---|---|---|
| | PSet_L:H,PSet_H:L | 000000000000 | STAY |
| 0001 | | 000000000001 | PJUMP1_B |
| 0001 | | 000000000010 | PJUMP1_B |
| 0001 | | 000000000011 | PJUMP1_B |
| 1001 | | 000000000010 | PJUMP1_B |
| 0110 | | 000000100010 | PJUMP32_B |
| | PUSH_ADD: H | 000000100010 | |
| 0110 | | 000001000010 | PJUMP32_B |
| 1111 | | 111110111101 | COMPLEMENT_B |
| | POP_ADD: H | 000000100010 | |

As understood from the above description, it is possible to access all memory cells by generating internal row and column addresses using a 4-bit address as a jump command. Various test patterns are written in a memory cell array 100 by variously selecting rows and columns using the jump function. This test method improves a test capacity as compared with a manner where test patterns are stored and used in a memory device. Since accessing all memory cells using six address pads, five control pads and one voltage measurement pad, four memory devices are tested by a tester having 50 channels. Furthermore, simultaneous testing of four memory devices improves productivity and decreases cost.

Embodiments of the invention will now be described in a non-limiting way.

In accordance with one aspect of the invention, an integrated circuit system is provided which includes a tester having M channels; and a plurality of integrated circuit devices each having N channels for interface with an outside, wherein K ones of the N channels of each integrated circuit device are connected to the M channels of the tester during a test mode of operation, N being more than M and M being equal to or more than R*K (R is an integer).

The integrated circuit devices include semiconductor memory devices, and are tested at a wafer level. The N channels of each of the integrated circuit devices include channels for receiving control signals, channels for receiving address signals, and channels for inputting/outputting data. The K channels of each of the integrated circuit devices include a part of the channels for receiving the address signals. The partial address channels are used as channels for inputting/outputting data and as channels for receiving an address jump command expressed by a K-bit address during the test mode.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements as defined in the appended claims.

We claim:

1. An integrated circuit system comprising:
a tester having M channels; and
a plurality of integrated circuit devices each having N interface channels,
wherein the N channels comprise control channels for receiving control signals, address channels for receiving address signals, and data channels for inputting/outputting data,
wherein K ones of the N channels of each integrated circuit device are connected to the M channels of the tester during a test mode of operation, N being less than M, and M being equal to or more than R*K, where R is a positive integer; and
wherein the K channels comprise a subset of the address channels, wherein the subset of the address channels are additionally configured to function as data channels and to receive an address jump command expressed by a K-bit address during the test mode.

2. The integrated circuit system according to claim 1, wherein the integrated circuit devices include semiconductor memory devices.

3. The integrated circuit system according to claim 1, wherein the integrated circuit devices are tested at a wafer level.

4. The integrated circuit system according to claim 1, wherein each of the plurality of integrated circuit devices comprises a semiconductor memory device,
wherein the semiconductor memory device comprises an array of memory cells arranged in rows and columns;
a row selector circuit for selecting the rows in response to a row address; and a first address generator circuit for generating the row address in response to the address jump command, the row address being increased/decreased according to a least significant bit value of the address jump command.

5. The integrated circuit system according to claim 4, wherein the semiconductor memory device further comprises:
a column selector circuit for selecting the columns in response to a column address; and
a second address generator circuit for generating the column address in response to the address jump command, the column address being increased/decreased according to the least significant bit value of the address jump command.

6. The integrated circuit system according to claim 5, wherein the first and second address generator circuits are configured to have initial values when entering the test mode.

7. A semiconductor memory device comprising:
an array of memory cells arranged in rows and columns;
a row selector circuit for selecting the rows in response to a row address;
a plurality of address pads divided into a first group of address pads and a second group of address pads;
a first latch enable circuit for generating a first latch enable signal in response to an active command;
a first signal generator circuit for latching a first address jump command input from the first group of address pads in response to the first latch enable signal and for generating a plurality of first jump signals in response to the first address jump command during a test mode of operation; and
a row address generator circuit for generating the row address in response to the first jump signals, and for generating a next row address by increasing/decreasing a current row address according to the first address jump command.

8. The semiconductor memory device according to claim 7, wherein the second group of address pads is not used during the test mode of operation.

9. The semiconductor memory device according to claim 7, further comprising:
a column selector circuit for selecting the rows in response to a column address;
a second latch enable circuit for generating a second latch enable signal in response to a read/write command;
a second signal generator circuit for latching a second address jump command input from the first group of address pads in response to the second latch enable signal and generating a plurality of second jump signals according to the second address jump command during the test mode of operation; and
a column address generator circuit for generating the column address in response to the second jump signals, and for generating a next column address by increasing/decreasing a current column address according to the second address jump command.

10. The semiconductor memory device according to claim 7, wherein the row address generator circuit comprises a lower address generator circuit for generating a lower portion of the row address and an upper address generator circuit for generating an upper portion of the row address.

11. The semiconductor memory device according to claim 10, wherein the lower address generator circuit comprises:
address signal generators corresponding to the lower portion of the row address,
wherein each of the address signal generators includes:
a first register,
a first reset circuit for resetting the first register in response to reset signals,
a first detector circuit for detecting whether a carry is generated from an address signal generator of a previous stage and whether a corresponding jump signal is activated, and
a first add/subtract circuit for outputting a carry signal and a sum/subtract signal in response to output signals of the first detector circuit and the first register, the carry signal being transferred to an address signal generator of a next stage and the sum/subtract signal being transferred to the first register.

12. The semiconductor memory device according to claim 11, further comprising:
a second register for storing a value of the first register in response to an address input signal and for transferring the stored value to the first register in response to an address output signal.

13. The semiconductor memory device according to claim 11, wherein the upper address generator circuit comprises:
address signal generators corresponding to the upper portion of the row address,
wherein each of the address signal generators includes:
a second register,
a second reset circuit for resetting the second register in response to the reset signals,
a second detector circuit for detecting whether a carry is generated from an address signal generator of a previous stage,
a second add/subtract circuit for outputting a carry signal and a sum/subtract signal in response to output signals of the second detector circuit and the second register,
a third detector circuit for detecting whether a carry is generated from an address signal generator of a previous stage, and
a third add/subtract circuit for outputting a carry signal and a sum/subtract signal in response to output signals of the third detector circuit and the second register.

14. The semiconductor memory device according to claim 13, wherein the second add/subtract circuit and the third add/subtract circuit are configured to transfer an output signal to the second register based on whether a carry is generated from the last address generator of the lower address generator circuit.

15. The semiconductor memory device according to claim 13, further comprising:
a third register for storing a value of the second register in response to an address input signal and transferring the stored value to the second register in response to an address output signal.

16. The semiconductor memory device according to claim 13, wherein the second add/subtract circuit is configured to generate a carry signal and a sum/subtract signal when a carry is not generated by the last address generator of the lower address generator circuit and wherein the third add/subtract circuit is configured to generate a carry signal and a sum/subtract signal when a carry is generated from the last address generator of the lower address generator circuit.

17. The semiconductor memory device according to claim 9, further comprising:
control pads for receiving the active command and the read/write command, the control pads including pads for receiving /RAS, /CAS, /WE, CLK, and CKE signals.

18. The semiconductor memory device according to claim 7, further comprising:
a plurality of data pads for inputting/outputting data, wherein a subset of the data pads is configured to connect to the first group of address pads during the test mode of operation to output data from and input data to the first group of address pads.

19. A method comprising:
simultaneously testing a plurality of semiconductor devices with a single tester by generating relative addresses for one or more of the plurality of semiconductor devices, wherein generating relative addresses includes generating an address jump command and providing the address jump command to the plurality of semiconductor devices using a single channel on one or more of the plurality of semiconductor devices as a data channel and as an address channel, the address jump command indicating a relative distance between a first memory location and a second memory location.

* * * * *

UNITED STATES PATENT AND TRADEMARK OFFICE
CERTIFICATE OF CORRECTION

| | |
|---|---|
| PATENT NO. | : 7,370,237 B2 |
| APPLICATION NO. | : 10/779160 |
| DATED | : May 6, 2008 |
| INVENTOR(S) | : Hong-Beom Kim et al. |

Page 1 of 1

It is certified that error appears in the above-identified patent and that said Letters Patent is hereby corrected as shown below:

Column 16, line 15, the word "G11/G14" should read -- G10/G14 --;
Column 17, line 38, the word "integer;" should read -- integer, --.

Signed and Sealed this

Sixth Day of January, 2009

JON W. DUDAS
*Director of the United States Patent and Trademark Office*